United States Patent [19]
Kuramae et al.

[11] Patent Number: 5,843,829
[45] Date of Patent: *Dec. 1, 1998

[54] METHOD FOR FABRICATING A SEMICONDUCTOR DEVICE INCLUDING A STEP FOR FORMING AN AMORPHOUS SILICON LAYER FOLLOWED BY A CRYSTALLIZATION THEREOF

[75] Inventors: Masaki Kuramae, Kasugai; Fumitake Mieno, Kawasaki, both of Japan

[73] Assignees: Fujitsu Limited; VLSI Limited, both of Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 559,813

[22] Filed: Nov. 17, 1995

Related U.S. Application Data

[62] Division of Ser. No. 265,040, Jun. 24, 1994, abandoned.

[30] Foreign Application Priority Data

Sep. 14, 1993 [JP] Japan .................................. 5-229196

[51] Int. Cl.[6] .................................................. H01L 21/20
[52] U.S. Cl. ........................... 438/396; 438/398; 438/901
[58] Field of Search .............................. 437/60, 186, 191, 437/233, 239, 919; 438/901, 396, 398

[56] References Cited

U.S. PATENT DOCUMENTS

| | | |
|---|---|---|
| 4,441,249 | 4/1984 | Alspector et al. . |
| 4,748,133 | 5/1988 | Griswold .................................. 437/161 |
| 4,814,291 | 3/1989 | Kim et al. . |
| 5,045,488 | 9/1991 | Yeh .......................................... 437/913 |
| 5,210,598 | 5/1993 | Nakazaki et al. . |
| 5,223,080 | 6/1993 | Ohta et al. ............................... 156/626 |
| 5,238,849 | 8/1993 | Sato ........................................... 437/32 |
| 5,315,140 | 5/1994 | Sugahara et al. ....................... 257/306 |
| 5,422,287 | 6/1995 | So ............................................. 437/62 |
| 5,480,826 | 1/1996 | Sugahara et al. ......................... 437/60 |
| 5,514,880 | 5/1996 | Nishimura et al. ....................... 257/70 |
| 5,514,885 | 5/1996 | Myrick .................................... 257/216 |
| 5,563,093 | 10/1996 | Koda et al. ............................. 437/967 |

FOREIGN PATENT DOCUMENTS

| | | |
|---|---|---|
| 6-260644 | 9/1964 | Japan . |
| 63-010573 | 1/1988 | Japan . |

OTHER PUBLICATIONS

Campo et al., Poly–Si thin film transistors fabricated with rapid thermal processing, Rapid Thermal and Integrated Processing II, Eds. Gelpey et al., Meter. Res. Soc., pp. 389–394, Apr. 12, 1993.

Wolf s. and R. N. Tauber, "Silicon Processing for the VLSI Era", vol. 1, p. 184, 1986.

*Primary Examiner*—John Niebling
*Assistant Examiner*—Kevin F. Turner
*Attorney, Agent, or Firm*—Staas & Halsey

[57] ABSTRACT

A method for fabricating a semiconductor device includes the steps of depositing an amorphous silicon layer on a substrate, and forming an oxidation film on a surface of the amorphous silicon layer by treating the surface of the amorphous silicon layer with an oxidation gas. The forming step occurs before crystallization of the amorphous silicon layer.

10 Claims, 10 Drawing Sheets

LOAD IN/OUT

METHOD FOR FABRICATING A SEMICONDUCTOR DEVICE INCLUDING A STEP FOR FORMING AN AMORPHOUS SILICON LAYER FOLLOWED BY A CRYSTALLIZATION THEREOF

This application is a division of application Ser. No. 08/265,040, filed Jun. 24, 1994, now abandoned.

BACKGROUND OF THE INVENTION

The present invention generally relates to fabrication of semiconductor devices, and more particularly to the method for fabricating a semiconductor device including the step for forming an amorphous silicon layer followed by a crystallization step thereof.

In the fabrication of semiconductor devices, it is known to deposit a semiconductor layer in the amorphous state and to form a polycrystalline semiconductor layer from such an amorphous semiconductor layer. For example, a dynamic random access memory (DRAM) is formed by depositing a thin amorphous silicon layer first, followed by the formation of thin, fin-shaped electrodes of polysilicon. It should be noted that a stacked upon fin capacitor includes a number of electrode fins stacked each other. In the fabrication of such a stacked fin capacitor electrode, one or more amorphous silicon layers are deposited one after another, with intervening silicon oxide layers. As such a fabrication step includes the step of heating the amorphous silicon layer to a temperature of 800°–1000° C., the amorphous silicon layer generally experiences crystallization as a result of the high temperature. In other words, the amorphous silicon layer is converted to a polysilicon layer as a result of the heating. By forming the electrode of the stacked fin capacitor by way of deposition of an amorphous silicon layer, it becomes possible to obtain an electrode having an extremely smooth surface. Thus, by using the electrode having such a smooth surface, it becomes possible to deposit a very thin dielectric layer on the surface of the electrode without introducing therein defects such as a pinhole.

FIG. 1 shows the structure of a conventional DRAM including a stacked fin capacitor.

Referring to FIG. 1, the illustrated device is constructed on a p-type substrate 1 covered by a field oxide film 2, wherein the field oxide film 2 includes an aperture defining a device region 2a. Thus, the surface of the substrate 1 is exposed in correspondence to the device region 2a, and a polysilicon pattern forming a word line WL extends over the surface of the substrate thus exposed.

In the device region 2a, $n^+$-type diffusion regions 4 and 7 are formed at both sides of the word line WL acting as the gate of a MOS transistor Tr, as source and drain regions. Further, a p-type channel region CH is formed immediately below the word line. Although not illustrated, it should be noted that there is formed a thin gate insulation film underneath the word line WL acting as the gate, similarly to other MOS transistors. Further, another word line WL extends on the field oxide film 2 in parallel to the word line WL described previously.

On the field oxide film 2, an insulator layer 3 of silicon oxide is deposited such that the insulator layer 3 covers the word line WL as well as the device region 2a. Further, the insulator layer 3 is formed with contact holes 5 and 8 such that the contact holes expose the diffusion regions 4 and 7. On the insulator layer 3, a polysilicon pattern is provided as a bit line BL such that the bit line BL passes over the contact hole 8, wherein the bit line BL establishes a contact to the diffusion region 7 at the contact hole 8. On the other hand, a stacked fin capacitor Q is formed on the insulator layer 3 in correspondence to the contact hole 5 such that the capacitor Q is connected to the diffusion region 4 via the contact hole 5.

It should be noted that the stacked fin capacitor Q includes a hollow polysilicon trunk 6a contacted to the diffusion region 4 at the contact hole 5 and a fin region 6 formed of a number of thin polysilicon fins 6b–6d connected commonly to the trunk 6a, wherein the polysilicon fins 6b–6d extend laterally. Further, a thin dielectric film 6e of silicon oxide or silicon nitride ($Si_3N_4$) is formed on the surface of the foregoing polysilicon fins 6b–6d as well as on the inner surface of the hollow trunk 6a. Further, there is provided a polysilicon layer forming an opposing electrode 6f at the outside of the dielectric film 6e such that the dielectric film 6e is sandwiched between the fin electrode 6 and the opposing electrode 6f. Generally, the electric charges accumulated in a capacitor increase with decreasing thickness of the dielectric film of the capacitor. Thus, it is desirable to reduce the thickness of the dielectric film 6e as much as possible in the stacked fin capacitor Q. In fact, a silicon nitride film having a thickness of about 7 nm is used for the dielectric film 6e.

When using such a thin dielectric film for the stacked fin capacitor, it is necessary to form the surface of the polysilicon fin as smooth as possible to avoid formation of defects such as a pinhole. Thus, it has been practiced to form the polysilicon fin by first depositing an amorphous silicon film by a vapor phase deposition process such as CVD (chemical vapor deposition), followed by a step of providing a conductivity thereto by way of ion implantation or other suitable doping process. As the amorphous silicon layer has an extremely smooth surface, the polysilicon layer formed as a result of crystallization of such an amorphous silicon layer also has a smooth surface.

On the other hand, the fabrication of semiconductor devices having a complex structure as in the case of the device of FIG. 1, includes a large number of fabrication steps, and there is a tendency that the throughput of production is reduced. In order to improve the throughput as much as possible, recent semiconductor plants use so-called cluster type production systems wherein unnecessary transport or storage process is minimized or eliminated. In the cluster type production system, various processing stations such as vapor phase deposition apparatuses and etching apparatuses are connected with each other by a transportation chamber. The product in fabrication is transported between various processing stations one by one via the transportation chamber, without contacting the air outside.

FIG. 2A shows an example of such a cluster type vapor phase deposition apparatus.

Referring to FIG. 2A, the apparatus includes a first reaction chamber 11a and a second reaction chamber 11b, as well as a transportation chamber 12 connecting the foregoing first and second reaction chambers 11a and 11b. Further, each of the reaction chambers has a construction shown in FIG. 2B.

Referring to FIG. 2B, the reaction chamber includes a shower nozzle $11_1$ supplied with a source gas via a piping $11_2$, and a substrate $11_4$ is held on a holder $11_3$ that includes therein a heater mechanism (not shown) such that the substrate $11_4$ faces the shower nozzle $11_1$. The source gas is introduced from the shower nozzle $11_1$ to the surface of the substrate $11_4$ heated by the heater mechanism, wherein the constituent atoms of the semiconductor layer to be deposited are released as a result of the pyrolytic decomposition of the source gas in the vicinity of the substrate 11₄. In the vapor phase deposition apparatus of FIG. 2A, one may conduct the deposition of the amorphous silicon layer forming the fins 6b–6d in the first reaction chamber 11a and conduct the deposition of a dielectric film 6e on the foregoing amorphous silicon layer.

The substrate processed in the reaction chamber 11a is transported one by one to the reaction chamber 11b via the transport chamber 12, while the loading and unloading of the substrate to and from the transportation chamber 12 is carried out via a load gate 13. The transportation chamber 12 is filled with an inert gas such that the substrate does not contact with the air in the external environment even when it is transported between processing stations. By using such a cluster type vapor phase deposition apparatus, it becomes possible to eliminate the conventional processes, employed in the conventional stand alone type apparatuses, for storing half products obtained after the processing in the reaction chamber 11a and for transporting such half products for a long distance as a batch. As a result, the throughput of the production of semiconductor devices increases substantially.

FIG. 3 shows another example of the cluster type vapor phase deposition apparatus.

Referring to FIG. 3, the apparatus includes a first reaction chamber 11a' and a second reaction chamber 11b' connected with each other by a transportation chamber 12' and processes a plurality of substrates simultaneously in each of the reaction chambers. In correspondence to each of the reaction chambers 11a' and 11b', there is provided an external heating device such as an infrared lamp for heating the substrates in the reaction chamber. Thus, the apparatus of FIG. 3, capable of processing a plurality of substrates simultaneously, can realize a high throughput of production.

Meanwhile, the inventors of the present invention have discovered that the surface of the electrode fins 6b–6d becomes rough when a DRAM shown in FIG. 1 is fabricated by using such a cluster type vapor phase deposition apparatus, particularly in the step of crystallizing the amorphous silicon layer deposited in the reaction chamber 11a as the electrode fins 6b–6d. When the surface of the fins 6b–6d becomes rough, the chance that defects such as pinholes are formed in the thin dielectric film 6e on the amorphous silicon layer, increases substantially. When such a pinhole is formed, the capacitance of the capacitor decreases substantially. It is believed that such a rough surface develops as a result of the grain growth of silicon crystals at the time of crystallization of the amorphous silicon layer.

It should be noted that such a roughening of the surface of the silicon layer associated with the crystallization of the amorphous silicon layer appears characteristically when a cluster type production facility is used for increasing the throughput of production. As long as a conventional stand alone type apparatus is used, the problem does not emerge. Thus, there has been a problem in the conventional fabrication process of semiconductor devices, an example being a DRAM, in that the cluster type apparatus cannot be used effectively for improving the throughput of production.

SUMMARY OF THE INVENTION

Accordingly, it is a general object of the present invention to provide a novel and useful fabrication method of a semiconductor device wherein the foregoing problems are eliminated.

Another and more specific object of the present invention is to provide a method for fabricating a semiconductor device that uses a cluster type apparatus such that a plurality of semiconductor substrates, deposited with an amorphous silicon layer as a result of a processing in a first processing station, are subjected to a heat treatment process in a second station, while transporting the substrates one by one from said first station to said second station each time the processing for a substrate is completed in said first station without exposing the substrates to external atmosphere, such that a crystallization occurs in the amorphous silicon layer in said second station, wherein the problem of roughening of the surface of said amorphous silicon layer is substantially eliminated.

Another object of the present invention is to provide a method for fabricating a semiconductor device, comprising the steps of:

setting the temperature of a substrate held in a vapor deposition apparatus to a first temperature;

depositing an amorphous silicon layer on a surface of said substrate by introducing a source gas containing silicon to said vapor deposition apparatus such that said source gas is decomposed in the vicinity of a surface of said substrate;

elevating the temperature of said substrate, after said step of deposition for depositing said amorphous silicon layer, from said first temperature to a second, higher temperature, said second temperature being chosen such that a crystallization occurs in said amorphous silicon layer; and crystallizing said amorphous silicon layer by holding the temperature of said substrate at said second temperature to convert said amorphous silicon layer to a polysilicon layer;

wherein said step of elevating the temperature comprises an oxidation step for introducing a gas that contains oxygen in gas molecules to said vapor deposition apparatus before a crystallization occurs in said amorphous silicon layer, such that an oxide film is formed on the surface of said amorphous silicon layer.

Another object of the present invention is to provide a method for fabricating a semiconductor device, comprising the steps of:

setting the temperature of a substrate held in a vapor deposition apparatus to a first temperature;

depositing an amorphous silicon layer on a surface of said substrate by introducing a source gas containing silicon to said vapor deposition apparatus such that said source gas decomposed in the vicinity of a surface of said substrate;

elevating the temperature of said substrate, after said step of depositing said amorphous silicon layer, from said first temperature to a second, higher temperature, said second temperature being chosen such that a crystallization occurs in said amorphous silicon layer; and crystallizing said amorphous layer by holding the temperature of said substrate at said second temperature;

wherein there is provided an oxidation step, after said step of depositing the amorphous silicon layer and before a moment in which crystallization occurs in said amorphous layer, for introducing a gas containing oxygen in gas molecules, such that an oxidation film is formed on a surface of said amorphous silicon layer.

According to the present invention, it is possible to suppress the diffusion of silicon atoms along the surface of the amorphous silicon layer by providing an oxide film on the surface of the amorphous silicon layer. As a result, the growth of silicon crystals in the direction perpendicular to the plane of the substrate is effectively suppressed at the time of crystallization of the amorphous silicon layer. It is believed that such an artificial oxide film performs the role of the native oxide film that prevents the grain growth of silicon crystals and hence the development of rough surface in the crystallization of amorphous silicon layer in the conventional production system that uses a stand alone type deposition apparatuses.

It should be noted that the substrate has been left in the air for a long time period in the conventional batch type production system that uses a stand alone type vapor deposition apparatuses, after the step for depositing an amorphous silicon layer. Thus, the conventional fabrication process of semiconductor devices implicitly and inevitably includes the step of forming a native oxide film on the surface of the amorphous silicon layer that suppresses the diffusion of the silicon atoms along the surface of the amorphous silicon layer. Thus, such a native oxide film has suppressed the development of the rough surface in the crystallization of the amorphous silicon layer. When a cluster type apparatus is used for increasing the throughput, on the other hand, the substrate deposited with the amorphous silicon layer does not have a chance to contact with the air outside the deposition apparatus. Thus, no formation of native oxide film occurs on the surface of the amorphous silicon layer. In the present invention, an oxide film acting the role of the native oxide film is formed artificially on the surface of the amorphous silicon layer by introducing an oxidation gas to the vapor phase deposition apparatus for preventing the development of the rough surface.

According to the present invention, it becomes possible to produce semiconductor devices such as a DRAM that include a polysilicon layer formed as a result of crystallization of an amorphous silicon layer, with a high throughput, by using the cluster type production apparatus, without causing the development of rough surface of the polysilicon layer. When fabricating a DRAM, in particular, it becomes possible to maintain the surface of the fin electrodes forming a capacitor smoothly even when there occurred a crystallization of the amorphous silicon layer. Thus, it becomes possible to form an extremely thin dielectric film on the surface of the polysilicon layer thus crystallized, with a uniform thickness and without introducing defects. As the capacitor having such a thin dielectric film has a large capacitance, the DRAM fabricated as such also provides a large capacitance.

DETAILED DESCRIPTION OF PREFERRED EMBODIMENTS

Hereinafter, a first embodiment of the present invention for the fabrication process of an MIM capacitor will be described with reference to FIGS. 4A–4D.

Figure 1:
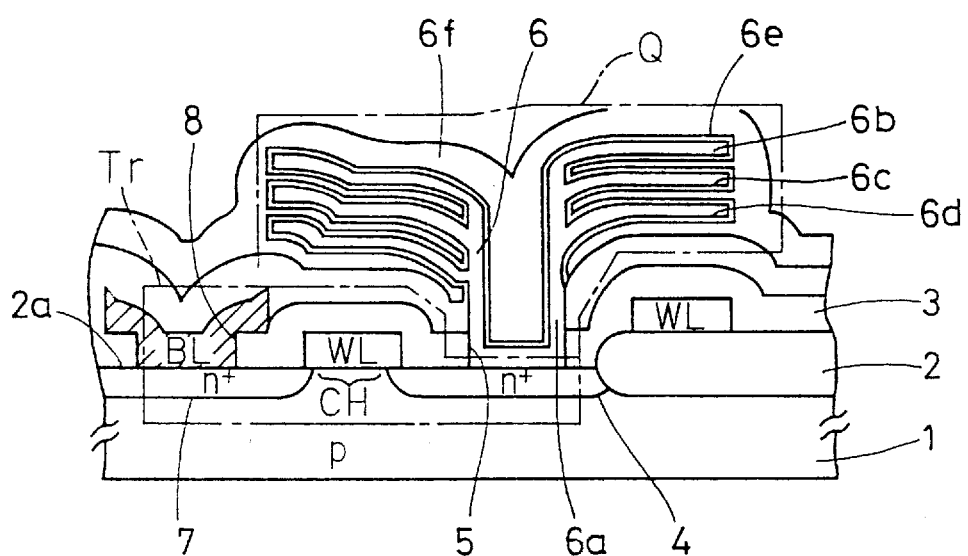
FIG. 1 is a diagram showing the cross section of a conventional stacked fin capacitor.
Figure 2A:
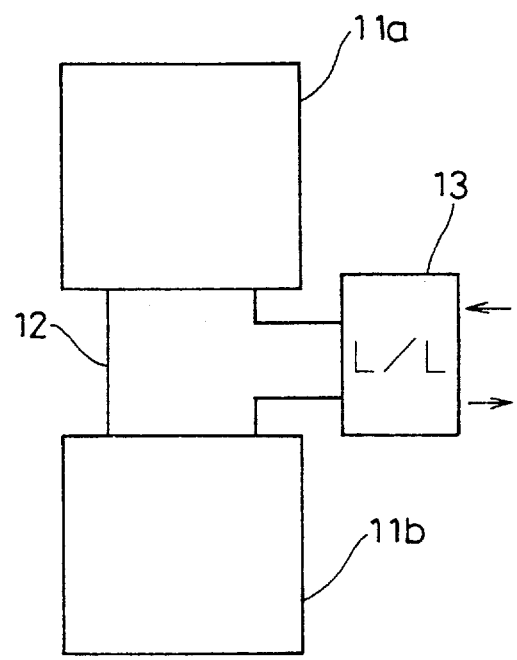
FIGS. 2A and 2B are diagrams showing the schematical construction of the cluster type vapor deposition apparatus used in the present invention.
Figure 2B:
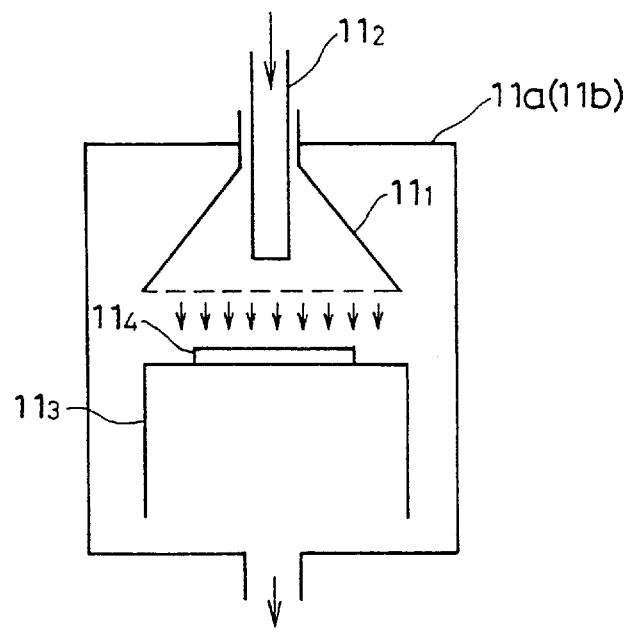
Figure 4A:
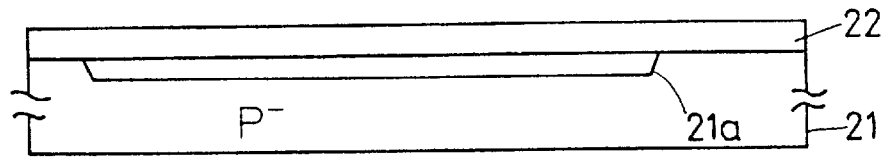
FIGS. 4A–4D are diagrams showing the fabrication of an MIM capacitor according to a first embodiment of the present invention.

In the step of FIG. 4A, an $n^+$-type diffusion region 21a is formed on a substrate 21 of a $p^-$-type silicon single crystal. Further, an amorphous silicon layer 22 is deposited on the substrate 21 by a vapor deposition apparatus shown in FIG. 2A or 2B so as to cover the foregoing diffusion region 21a. Typically, the amorphous silicon layer 22 is formed by holding the substrate 21 in a reaction chamber 11a of FIG. 2A and a source gas such as disilane ($Si_2H_6$) is introduced into the reaction chamber 11a. The amorphous silicon layer 22 is formed with a thickness of about 100 nm by causing a pyrolytic decomposition in the source gas thus introduced at a first temperature of about 450° C. Typically, the internal pressure of the reaction chamber 11a is set to about 10 Torr. In the illustrated example, the source gas of disilane and a carrier gas of $N_2$ were supplied with respective flowrates of 10 cc/min and 1000 cc/min. The amorphous silicon layer 22 thus deposited has no grain boundary and shows a very smooth surface with a surface roughness of less than several nanometers, in correspondence to the surface of the single crystal substrate 21.

Figure 4B:
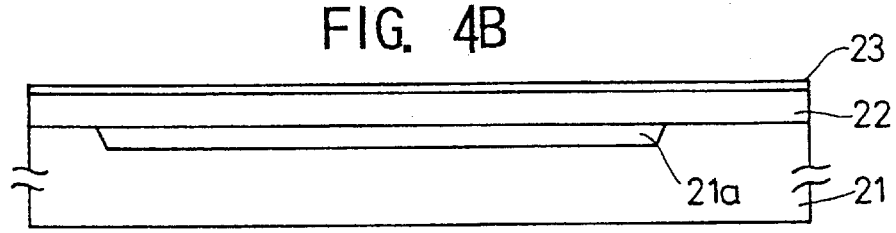

Next, in the step of FIG. 4B, the temperature of the substrate 21 is elevated from 450° C. to a second temperature of 600° C. or more, preferably 800° C. or more, while holding the substrate 21 in the reaction chamber 11a. Further, an oxidation gas containing oxygen in the molecules is introduced into the reaction chamber 11a concurrently to or after the onset of the temperature elevation process. In the illustrated example, a nitrogen monoxide ($N_2O$) gas is introduced to the reaction chamber 11a for 30 minutes at the moment when the substrate temperature has reached 800° C., with a flowrate of 1000 cc/min. The $N_2O$ gas thus introduced into the reaction chamber 11a experiences a pyrolytic decomposition at the foregoing second temperature, and oxygen atoms are released as a result. The oxygen atoms thus released cause an oxidation of the surface of the amorphous silicon layer 22, and an oxide film 23 having a thickness less than about 5 nm is formed on the surface of the amorphous silicon layer 22 as indicated in FIG. 4B as a result of the oxidation. In order to facilitate the pyrolytic decomposition of the oxidation gas, the foregoing second temperature is set above the temperature of pyrolytic decomposition of the oxidation gas. It should be noted that the temperature of pyrolytic decomposition is about 600° C. in the case $N_2O$ is used for the oxidation gas. Thus, the foregoing second temperature is set to 600° C. or more in the temperature elevation process of FIG. 4B.

Figure 4C:
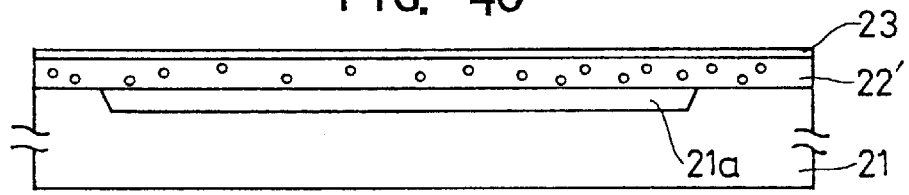

After the step of FIG. 4B, the atmosphere of the reaction chamber 11a is switched to nitrogen ($N_2$), and the substrate is applied with a heat treatment process at a temperature of 800°–1000° C., while flowing $N_2$ with a flowrate of 1000 cc/min. As a result of the heat treatment process, the amorphous silicon layer 22 experiences crystallization as indicated in FIG. 4C, and a polysilicon layer 22' replaces the amorphous silicon layer 22. It should be noted that, because of the fact that the oxide film 23 covers the surface of the amorphous silicon layer 22, the diffusion of the silicon atoms along the surface of the layer 22 is effectively suppressed during the process of crystallization of the amorphous silicon layer 22. Thus, the grain growth of the silicon grains in the polysilicon layer 22' in the direction vertical to the surface of the layer 22' is effectively suppressed. As a result, the polysilicon layer 22' shows a smooth surface similar to the smooth surface of the original amorphous silicon layer 22.

Figure 4D:
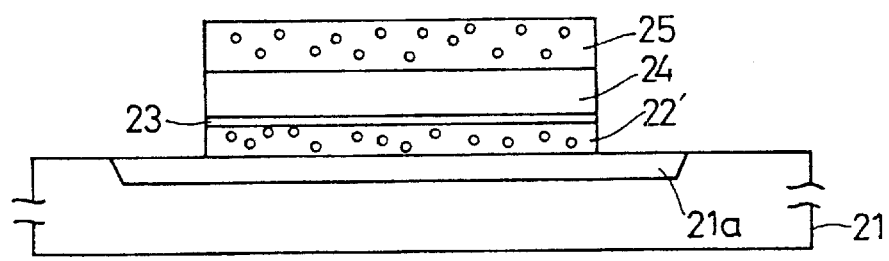

After the step of FIG. 4C, the temperature of the reaction chamber 11a is lowered to the room temperature. Further, the substrate 21 is transported to the second reaction chamber 11b via the transportation chamber 12 filled with an inert gas such as nitrogen, without exposing to the air. In the reaction chamber 11b, a silicon oxide film 24 acting as the capacitor dielectric film is deposited on the polysilicon layer 22' as indicated in FIG. 4D. Typically, the pressure of the reaction chamber 11b is set to about 10 Torr, and the $SiO_2$ layer 24 is deposited with a thickness of about 20 nm as a result of reaction between silane ($SiH_4$) and nitrogen monoxide ($N_2O$). Further, a polysilicon layer 25 forming the opposing electrode of the capacitor is deposited with a thickness of about 100 nm, as a result of pyrolytic decomposition of disilane ($Si_2H_6$) at a temperature of 400°–650° C. Further, the layered body thus obtained is subjected to a patterning process in the step of FIG. 4D to form the desired capacitor, such that the $n^+$-type region 21a acting as a capacitor electrode is exposed.

In the foregoing steps of FIGS. 4A–4D, one may conduct the step of FIG. 4C in the second reaction chamber 11b. In this case, the substrate 21 is immediately transported to the reaction chamber 11b via the transportation chamber 12 without exposing to the air, after the process in the reaction chamber 11a for forming the oxide film 23 is completed. In the reaction chamber 11b, the $SiO_2$ layer 24 and the polysilicon layer 25 are deposited directly on the oxide film 23 covering the amorphous silicon layer 22. As the substrate 21 is held at the substrate temperature of 800° C. or more, a crystallization occurs in the amorphous silicon layer 22 similarly to the step of FIG. 4C, during the deposition of the layers 24 and 25.

Figure 5:
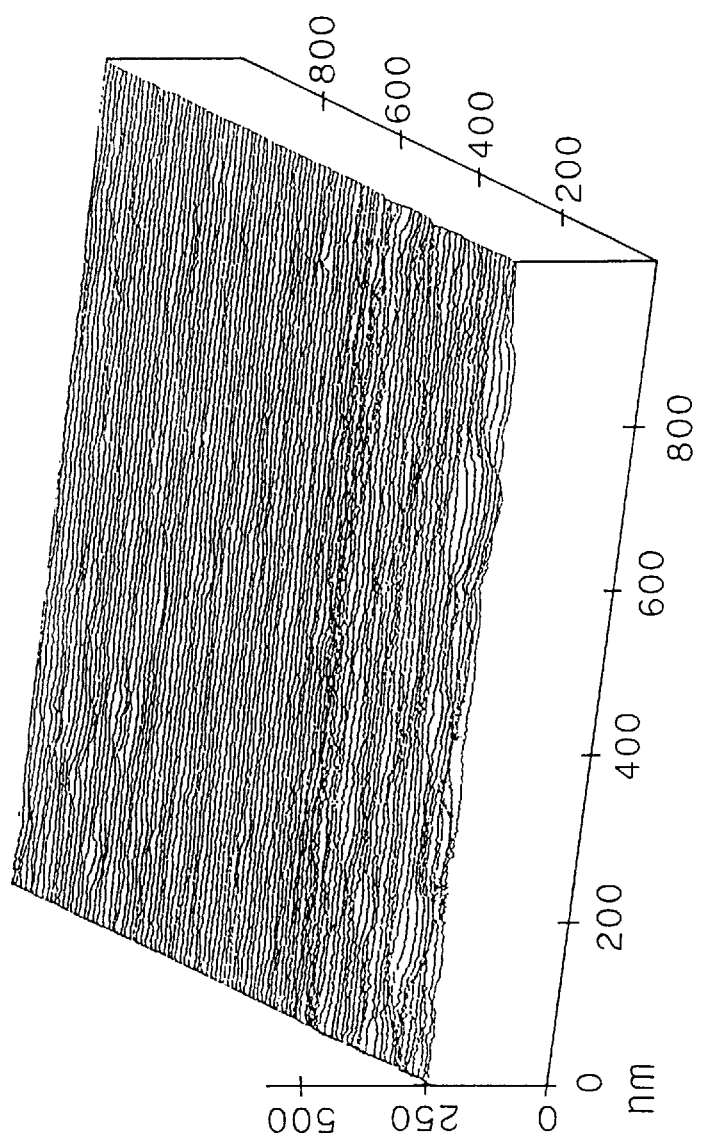
FIG. 5 is a diagram showing the surface morphology of a polysilicon layer obtained as a result of the present invention.

FIG. 5 shows the surface morphology of the polysilicon layer 22', more strictly the surface of the oxide film 23 covering the polysilicon layer 22', observed by an atomic force microscope. As will be seen clearly from FIG. 5, the polysilicon layer 22' shows an extremely flat and smooth surface, with projections and depressions less than several nanometers in magnitude.

Figure 3:
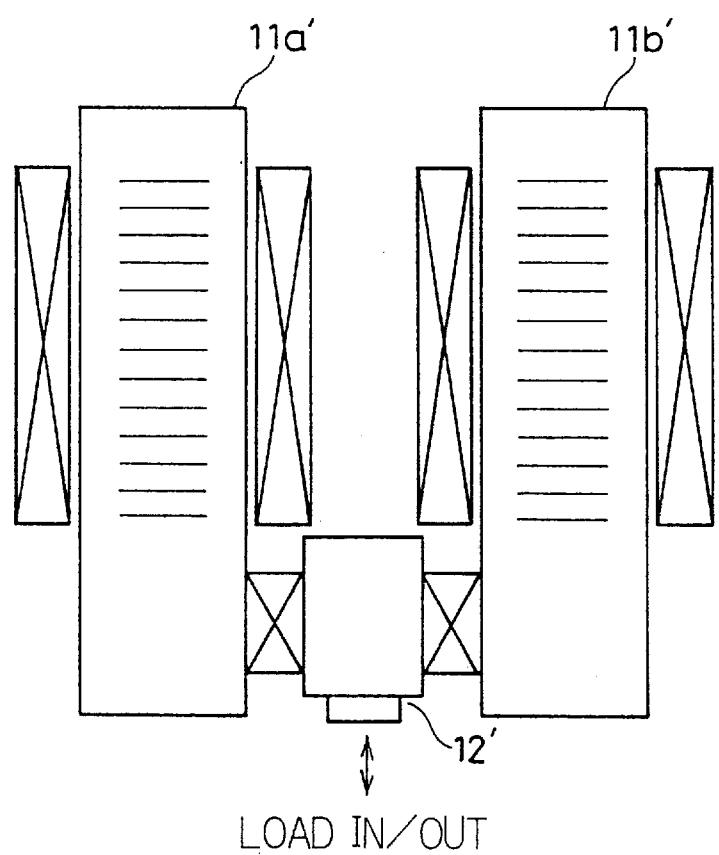
FIG. 3 is a diagram showing the construction of another cluster type vapor deposition apparatus.
Figure 6:
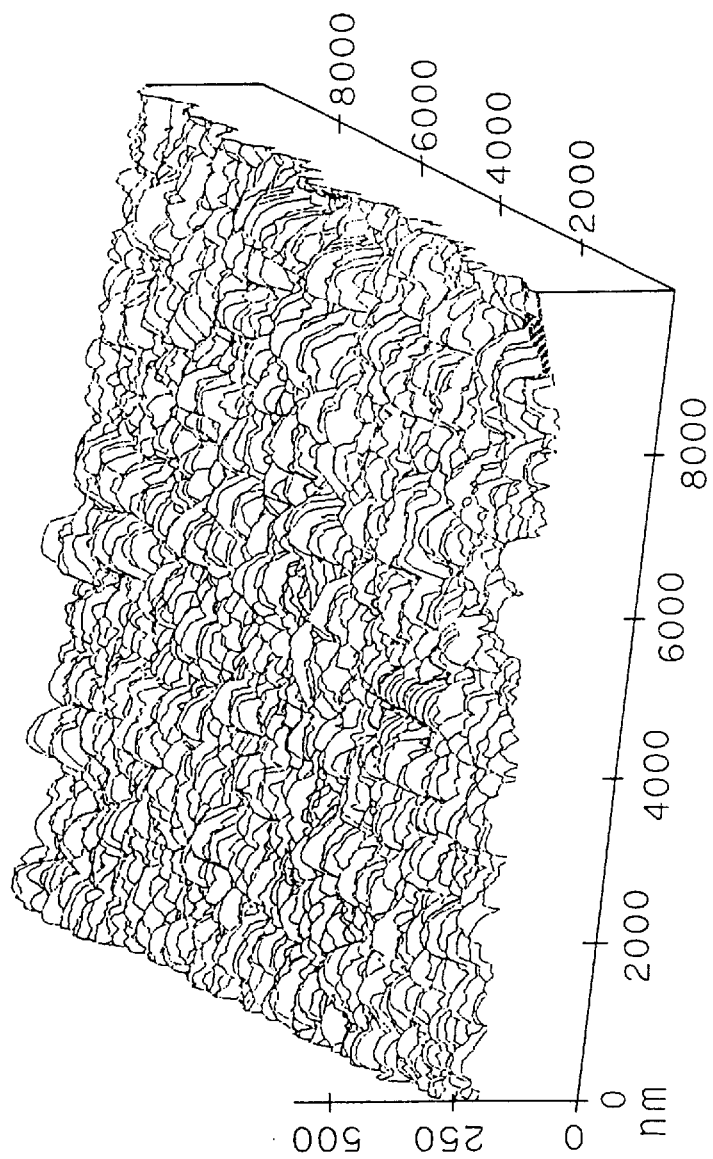
FIG. 6 is a diagram showing the surface morphology of a polysilicon layer crystallized immediately after the deposition of an amorphous silicon layer.

FIG. 6 shows the surface morphology of the polysilicon layer 22' in which the step for forming the oxide film 23 on the surface of the amorphous silicon layer 22 is omitted. As will be seen from FIG. 3, there occurs a conspicuous grain growth in the amorphous silicon layer 22 as a result of crystallization of amorphous silicon, when the formation of the oxide film 23 is omitted. It will be noted that the projections and depressions thus formed in the layer 22' have a magnitude of more than several tens of nanometers, some reaching even 100 nanometers.

As the polysilicon layer 22' formed by the steps of FIGS. 4C and 4D has an extremely smooth surface, the dielectric film 24 formed thereon is substantially free from defects such as pinholes, even when the thickness of the film 24 is reduced. As a result, it becomes possible to increase the capacitance of the capacitor substantially.

Figure 7:
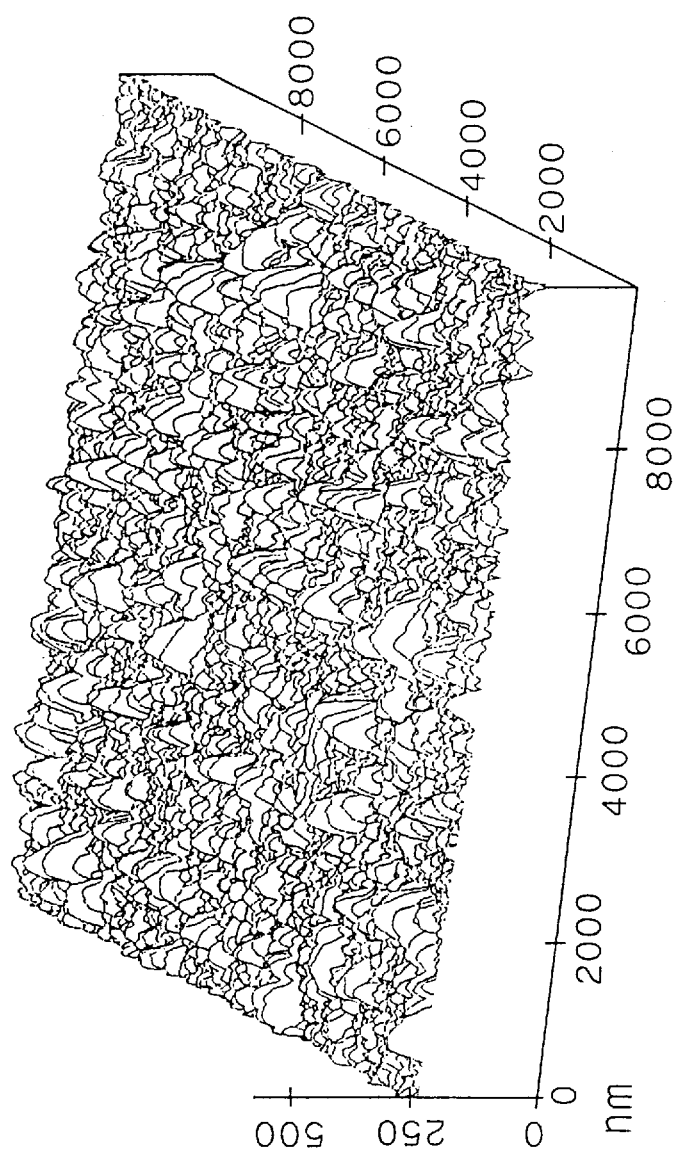
FIG. 7 is a diagram showing the surface morphology of a polysilicon layer crystallized after a short exposure to the air after the step of depositing an amorphous silicon layer.

FIG. 7 shows the surface morphology of a polysilicon layer 23 crystallized from the amorphous silicon layer 22 without the step of FIG. 4B for forming the oxide film 23. In this case, it should be noted that the substrate 21 is taken out from the vapor phase deposition apparatus to the air, after the step of FIG. 4A and before the step of the crystallization, for about 30 minutes. It is expected that such an exposure to the air causes a formation of native oxide film on the surface of the amorphous silicon layer 22. The result of FIG. 4 indicates, however, that the exposure to the air for such a short time is insufficient for the formation of the native oxide film that effectively prevents the grain growth of the silicon crystals by suppressing the atomic diffusion along the surface of the amorphous silicon layer.

In other words, the morphology control of the amorphous silicon layer during the crystallization process by forming an artificial oxide film is effective not only in the case wherein the crystallization occurs in the amorphous silicon layer immediately after the formation of the amorphous silicon layer without contacting to the air as in the case of the cluster type apparatus, but also in the case wherein the amorphous silicon layer is contacted to the air for a short time.

Next, a second embodiment of the present invention will be described with reference to FIGS. 8A–8H.

Figure 8A:
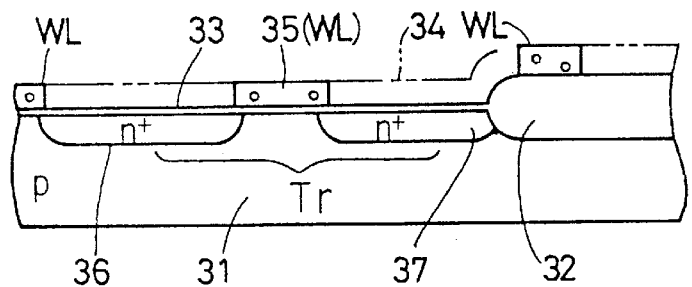
FIGS. 8A–8H are diagrams showing the fabrication process of a DRAM according to a second embodiment of the present invention.

Referring to FIG. 8A, a thin oxide film 33 is formed on the surface of a p-type silicon substrate 31 in correspondence to a memory cell region. Further, a thick field oxide film 32 is formed so as to define the memory cell region. Typically, the field oxide film has a thickness of about 400 nm, while the oxide film 33 has a thickness of about 10 nm. After the field oxide film 32 and the oxide film 33 thus formed, a plurality of polysilicon word lines WL is formed on the surface of the substrate 31 so as to extend in a parallel relationship. Thus, the part of the word line WL extending over the oxide film 33 acts as a gate electrode 35 of the transfer gate transistor Tr, and the oxide film 33 underneath the word line WL acts as a gate oxide film. Typically, the polysilicon word lines WL are formed by depositing a polysilicon layer with a thickness of about 200 nm and conducting an ion implantation process for introducing phosphorus ions with a concentration of about $1 \times 10^{20}/cm^3$, followed by a patterning step. Further, $n^+$-type diffusion regions 36 and 37 are formed at both sides of the gate electrode 35 as the source region and the drain region of the transfer gate transistor Tr, by conducting an ion implantation process while using the gate electrode 35 as a self-alignment mask. Thus, the transfer gate transistor Tr includes a source region formed of the diffusion region 36, a drain region formed of the diffusion region 37, and a gate formed of the polysilicon gate electrode 35 connected to the word line, as usual.

On the surface of the layered body thus formed, a silicon oxide layer 38 is formed by a CVD process with a thickness of about 100 nm as usual, and a contact hole 39 is formed for exposing the surface of the diffusion region 36. Further, a polysilicon layer 40 and a tungsten silicide (WSi) layer 41 are deposited on the silicon oxide layer 38 consecutively with respective thicknesses of 50 nm and 100 nm, such that the polysilicon layer 40 establishes an electrical contact to the surface of the diffusion region 36 at the contact hole 39. After the layers 40 and 41 are deposited, the polysilicon layer 40 is provided with conductivity by introducing phosphorous ions to the polysilicon layer 40 with a dose of $4 \times 10^{15}/cm^2$ under an acceleration voltage of 70 keV. Further, the layers 40 and 41 are patterned to form bit lines BL in connection to the diffusion region 36. It should be noted that the layers 40 and 41 thus patterned act also as a source electrode 42 of the transfer gate transistor Tr. See the structure of FIG. 8B.

Figure 8B:
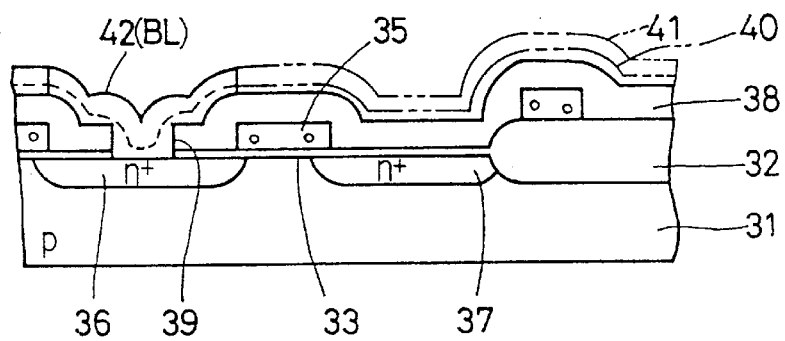

The structure of FIG. 8B is then to a vapor deposition apparatus, and an etching stopper layer 43 of $Si_3N_4$ is deposited thereon with a thickness of about 50 nm. Further, a silicon oxide layer 44 and an amorphous silicon layer 45 are deposited on the etching stopper layer 43 by a vapor deposition process with respective thicknesses of 30 nm and 20 nm. The amorphous silicon layer 45 is deposited as a result of pyrolytic decomposition of disilane at a temperature of 400°–550° C., preferably at 450° C., similarly to the previous embodiment. Of course, the source gas for forming the amorphous silicon layer 45 is not limited to disilane but other gases such as silane ($SiH_4$) or trisilane ($Si_3H_8$) may be employed.

In the present invention, the nitrogen monoxide ($N_2O$) is introduced to the vapor deposition apparatus after the amorphous silicon layer 45 is formed, and the substrate temperature is raised subsequently above the pyrolytic decomposition temperature of $N_2O$. As a result, a thin oxide film 45a is formed on the surface of the amorphous silicon layer 45 in correspondence to the oxide film 23 of FIG. 4B.

After the oxide film 45a is thus formed on the surface of the amorphous silicon layer 45, the substrate 31 is transported from the vapor phase deposition apparatus to the ion implantation apparatus via the transportation chamber of the cluster apparatus, without being exposed to the air. Further, an ion implantation of phosphorus is conducted in the ion implantation apparatus with a dose of $4 \times 10^{15}/cm^2$ under an acceleration voltage of 5 keV.

After the ion implantation, the substrate 31 is returned to the reaction chamber of the deposition apparatus via the transportation chamber without contacting the air. Further, a silicon oxide layer 46 is deposited on the amorphous silicon layer 45 at a temperature of about 1000° C. with a thickness of about 30 nm. Associated with the deposition of the silicon oxide layer 46, the amorphous silicon layer 45 experiences a crystallization and is converted to a polysilicon layer. As the surface of the amorphous silicon layer 45 is covered by the oxide film 45a, the crystallization of the layer 45 does not cause the problem of rough surface associated with the grain growth.

Figure 8C:
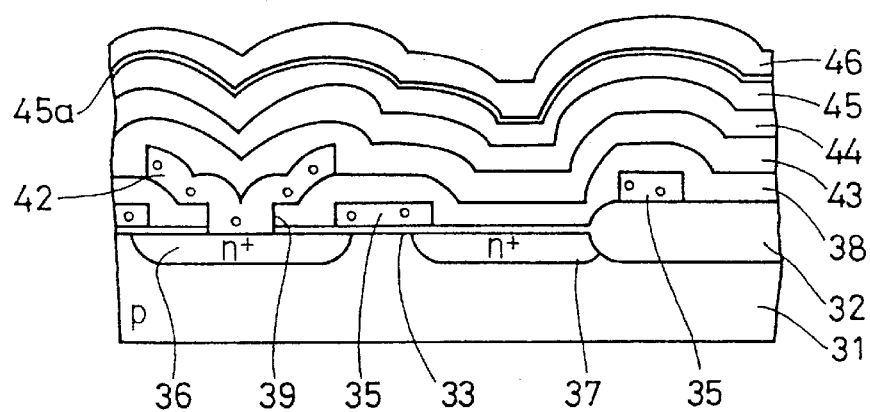
Figure 8D:
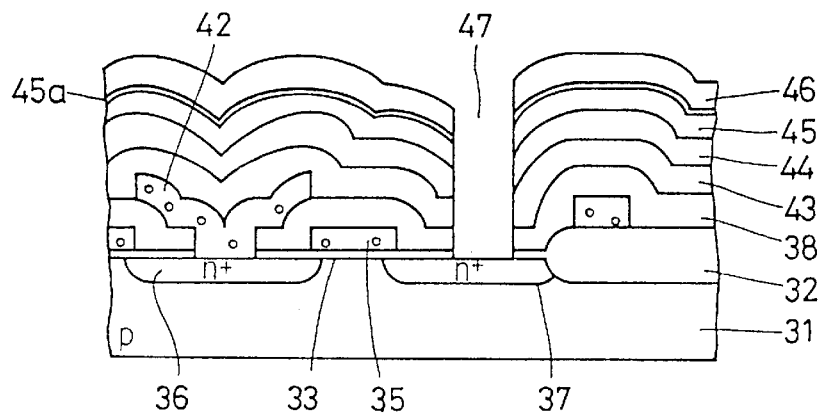

Next, a step of FIG. 8D is conducted wherein the structure of FIG. 8C is taken out from the vapor phase deposition apparatus, and a contact hole 47 is formed by a photolithographic process such that the contact hole 47 exposes the diffusion region 37 in the substrate 31.

Figure 8E:
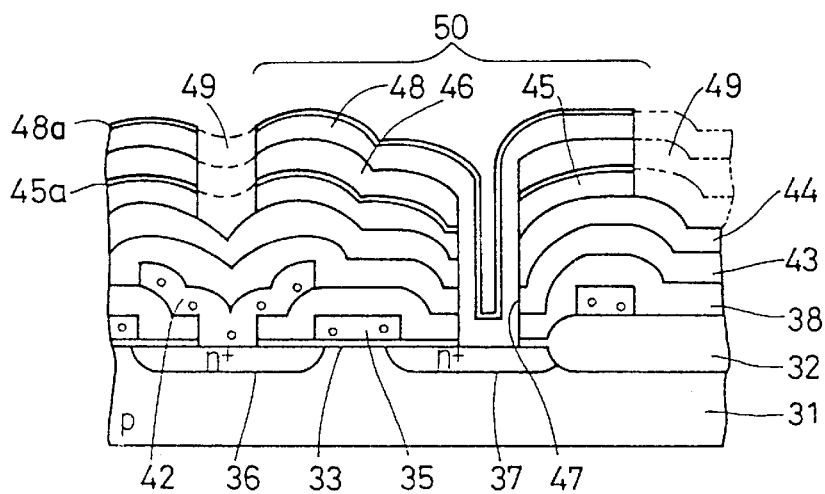

Further, in a step of FIG. 8E, the structure of FIG. 8D is returned to the vapor phase deposition apparatus, and an amorphous silicon layer 48 is deposited at 450° C. with a thickness of about 20 nm, such that the amorphous silicon layer 48 covers the side wall of the contact hole 47 as well as the surface of the exposed diffusion region 37. Further, the substrate temperature is raised to 800° C. and the nitrogen monoxide gas ($N_2O$) is introduced concurrently, to form a thin oxide film 48a on the surface of the layer 48. After the amorphous silicon layer 48 is thus formed, the layer 48 is continuously crystallized by the heat treatment at 800° C. while switching the atmosphere to nitrogen ($N_2$). As a result, the amorphous silicon layer 48 is converted to a polysilicon layer. The illustrated structure is then transported from the deposition apparatus to the ion implantation apparatus via the transportation chamber of the cluster apparatus, and the polysilicon layer thus formed is provided with a conductivity as a result of ion implantation of phosphorus.

Further, the layers 45–48 thus formed are subjected to a patterning process (see reference numerals 49) by way of a reactive ion etching (RIE) while using the silicon oxide layer 44 as an etching stopper, and a stacked fin electrode 50 is formed as indicated in FIG. 8E. In the structure of FIG. 8E, too, it should be noted that the rough surface does not develop in the layer 48 because of the formation of the oxide film 48a that suppresses the grain growth of the silicon crystals.

Figure 8F:
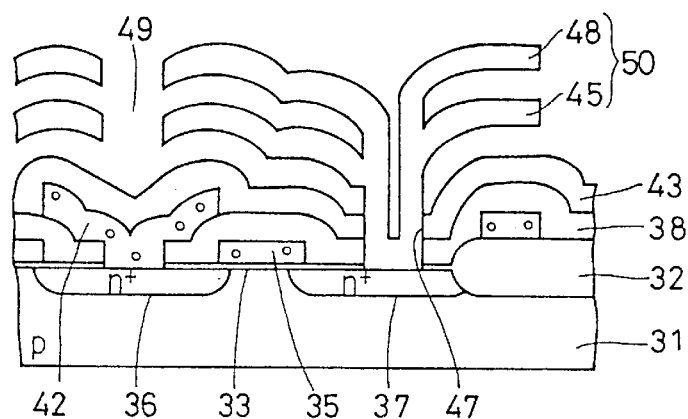

Next, in the step of FIG. 8F, the silicon oxide layers 44 and 46 are removed by way of a selective etching. As a result of the etching, the oxide films 45a and 48a are also removed simultaneously. Further, a silicon nitride film 53 is deposited on the surface of the polysilicon fin capacitor 50 by way of a vapor deposition process conducted at 800° C. with a thickness of about 7 nm. As the polysilicon capacitor 50 has an extremely smooth surface due to the crystallization conducted while suppressing the grain growth of silicon crystals by means of the oxide films 45a and 48a, there occurs no defects such as a pinhole in the silicon nitride film 53 even when the thickness of the film 53 is extremely small.

Figure 8G:
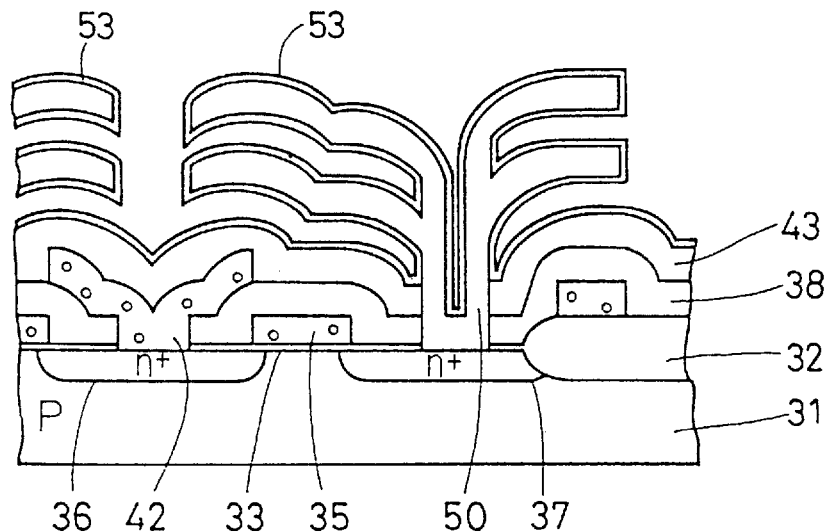
Figure 8H:
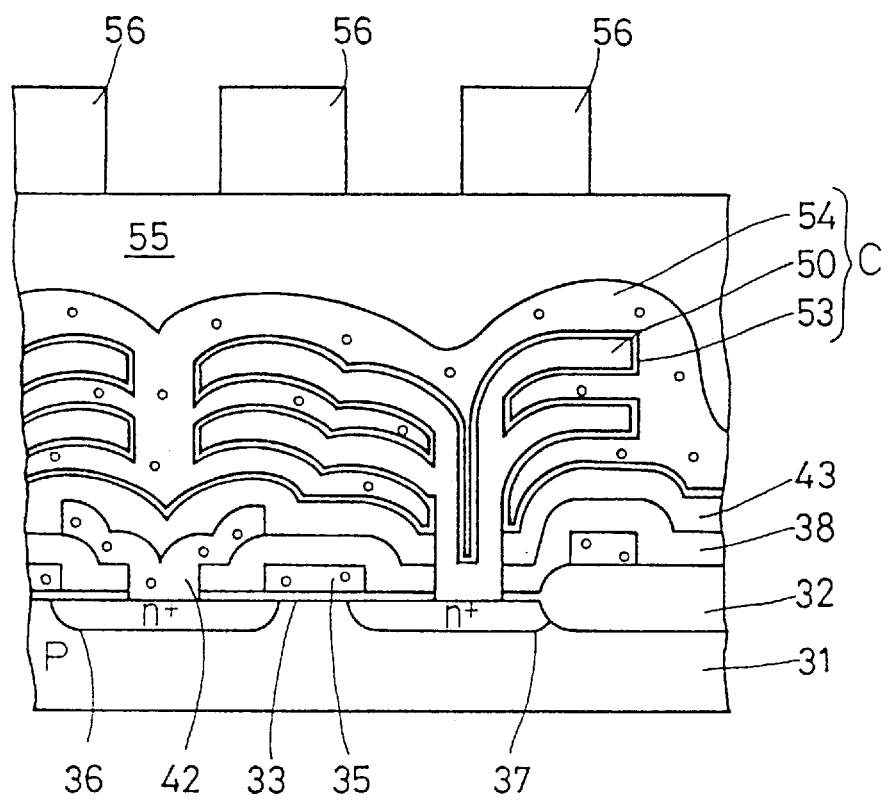

After the step of FIG. 8G, a polysilicon layer 54 is deposited on the structure of FIG. 8G as indicated in FIG. 8H, such that the polysilicon layer 54 forms an opposing electrode of the stacked fin capacitor. After the deposition of the polysilicon layer 54, the polysilicon layer 54 is provided with a conductivity by way of a thermal diffusion process of phosphorus that uses $POCl_3$. Further, a planarization layer 55 of spin-on-glass or boro-phosphorus silicate glass is formed for planarization, and an electrode 56 is provided thereon. As a result, a dynamic random access memory having a large capacitance is obtained as indicated in FIG. 8H.

In any of the foregoing first and second embodiments, it should be noted that the oxidation gas supplied to the vapor deposition apparatus for forming the oxide layer on the surface of the amorphous silicon layer is not limited to nitrogen monoxide ($N_2O$), but oxygen ($O_2$) or other various gases that contain oxygen atom in the molecule, such as $NO_x$, $CO$, $CO_2$, and the like, may be used.

Further, the present invention is not limited to the embodiments described heretofore, but various variations and modifications may be made without departing from the scope of the invention.

What is claimed is:

1. A method for fabricating a semiconductor device in a cluster type production system, comprising the steps of:

(a) setting the temperature of a substrate held in a vapor deposition apparatus of the system to a first temperature;

(b) depositing an amorphous silicon layer on a surface of said substrate by introducing a source gas containing silicon into said vapor deposition apparatus such that said source gas is decomposed in the vicinity of the surface of said substrate;

after said depositing step, (c) elevating the temperature of said substrate from said first temperature to a second, higher temperature capable of causing crystallization of said amorphous silicon layer, which converts the amorphous silicon layer to a polysilicon layer;

(d) introducing an oxidation gas into said vapor deposition apparatus before the crystallization to form an oxide film from said oxidation gas on the surface of said amorphous silicon layer thereby suppressing diffusion of silicon atoms along a surface of said amorphous silicon layer during the crystallization, and preventing the development of a rough surface on the polysilicon layer which is produced by the crystallization; and (e) crystallizing said amorphous silicon layer by holding the temperature of said substrate at said second temperature.

2. A method as claimed in claim 1, wherein said method further comprises the steps of:

depositing a dielectric film on said polysilicon layer;

and depositing a polysilicon electrode layer on said dielectric film.

3. A method as claimed in claim 1, wherein said oxidation gas contains an element other than oxygen.

4. A method as claimed in claim 1, wherein said oxidation gas is selected from a group consisting of $N_2O$, $NO_x$, $CO$, $CO_2$ and $O_2$.

5. A method as claimed in claim 1, wherein said introducing step occurs substantially simultaneously with said elevating step.

6. A method as claimed in claim 1, wherein said introducing step occurs when a temperature of said substrate has reached a temperature of pyrolytic decomposition of said oxidation gas.

7. A method as claimed in claim 1, wherein said introducing step occurs substantially continuously with said depositing step.

8. A method as claimed in claim 1, further comprising the step of:

removing said substrate from said deposition apparatus after said depositing step, wherein said elevating step and said crystallizing step are applied to said substrate that has been removed from said vapor deposition apparatus by said removing step.

9. A method as claimed in claim 8, wherein said removing step is conducted such that said substrate is exposed to the air for an interval in which there is no substantial formation of native oxide film on the surface of said amorphous silicon layer.

10. A method for fabricating a semiconductor device in a cluster type production system, comprising the steps of:

(a) setting a temperature of a substrate held in a vapor deposition apparatus of the system to a first temperature;

(b) depositing an amorphous silicon layer on a surface of said substrate by introducing a source gas containing silicon into said vapor deposition apparatus such that said source gas decomposes in the vicinity of a surface of said substrate;

(c) elevating the temperature of said substrate, after said depositing step, from said first temperature to a second, higher temperature which causes crystallization in said amorphous silicon layer to form a polysilicon layer; and (d) crystallizing said amorphous layer by maintaining said second temperature;

wherein there is provided an oxidation step, after said depositing step but before crystallization occurs in said amorphous layer, said oxidation step including the step of introducing a gas containing oxygen, such that an oxidation film is formed on a surface of said amorphous silicon layer to suppress diffusion of silicon atoms along the surface of said amorphous silicon layer during said crystallizing step, and to prevent the development of a rough surface on the polysilicon layer produced by said crystallizing step.

\* \* \* \* \*

UNITED STATES PATENT AND TRADEMARK OFFICE
CERTIFICATE OF CORRECTION

PATENT NO.:    5,843,829
DATED     :    December 1, 1998
INVENTOR(S):   Masaki KURAMAE et al.

It is certified that error appears in the above-identified patent and that said Letters Patent is hereby corrected as shown below:

On the title page, [73] Assignee, change to --Fujitsu Limited, Kawasaki Japan and Fujitsu VLSI Limited, Kasugai, Japan--.

Signed and Sealed this

Twenty-seventh Day of July, 1999

Attest:

Q. TODD DICKINSON

*Attesting Officer*    *Acting Commissioner of Patents and Trademarks*